United States Patent [19]

Bergemont et al.

[11] Patent Number: 5,594,685
[45] Date of Patent: Jan. 14, 1997

[54] METHOD FOR PROGRAMMING A SINGLE EPROM OR FLASH MEMORY CELL TO STORE MULTIPLE BITS OF DATA THAT UTILIZES A PUNCHTHROUGH CURRENT

[75] Inventors: Albert Bergemont; Min-hwa Chi, both of Palo Alto, Calif.

[73] Assignee: National Semiconductor Corporation, Santa Clara, Calif.

[21] Appl. No.: 422,146

[22] Filed: Apr. 13, 1995

Related U.S. Application Data

[63] Continuation-in-part of Ser. No. 357,115, Dec. 16, 1994.

[51] Int. Cl.$^6$ .................................................. G11C 16/02
[52] U.S. Cl. ........................ 365/185.03; 365/185.18; 365/185.27
[58] Field of Search ................... 365/185.03, 185.27, 365/185.18, 168, 185.28, 185.24

[56] References Cited

U.S. PATENT DOCUMENTS

| | | | |
|---|---|---|---|
| 4,181,980 | 1/1980 | McCoy | 365/45 |
| 4,279,024 | 7/1981 | Schrenk | 365/203 |
| 4,357,685 | 11/1982 | Daniele et al. | 365/189 |
| 4,698,787 | 10/1987 | Mukherjee et al. | 365/185 |
| 4,821,236 | 4/1989 | Hayashi | 365/185 |
| 5,021,999 | 6/1991 | Kohda | 365/168 |
| 5,043,940 | 8/1991 | Harari | 365/168 |
| 5,187,683 | 2/1993 | Gill | 365/185 |
| 5,204,835 | 4/1993 | Eitan | 365/185 |
| 5,218,569 | 6/1993 | Banks | 365/189.01 |
| 5,346,842 | 9/1994 | Bergemont | 437/52 |
| 5,394,362 | 2/1995 | Banks | 365/189.01 |
| 5,418,743 | 5/1995 | Tomioka et al. | 365/189.01 |

FOREIGN PATENT DOCUMENTS

| | | |
|---|---|---|
| 60-038881 | 2/1985 | Japan . |
| 63-172471 | 7/1988 | Japan . |

OTHER PUBLICATIONS

T. Blyth et al., "A Non–Volatile Analog Storage Device Using EEPROM Technology", ISSCC91/Session 11/Emerging Circuit Technologies/Paper TP11.7, Feb. 14, 1991 (3 Pages).
M. Horiguchi et al., "An Experimental Large–Capacity Semiconductor File Memory Using 16–Levels/Cell Storage", IEEE Journal of Solid–State Circuits, vol. 23, No. 1, Feb. 1988, pp. 27–33.
C. Bleiker et al. "A Four–State EEPROM Using Floating–Gate Memory Cells", IEEE Journal of Solid–State Circuits, vol. SC–22, No. 3, Jun. 1987, pp. 460–463.
N. Saks et al., "Observation of Hot–Hole Injection of NMOS Transistors Using a Modified Floating–Gate Technique", U.S. Government Publication (5 pages).
K. Oyama et al., "A Novel Erasing Technology for 3.3 V Flash Memory with 64 Mb Capacity and Beyond", 1992 IEEE, IEDM 92, pp. 607–610.
S. Yamada et al., "A Self–Convergence Erasing Scheme for a Simple Stacked Gate Flash EEPROM", 1991 IEEE, IEDM 91, pp. 307–310.
E. Takeda et al., "Device Performance Degradation Due to Hot–Carrier Injection at Energies Below the Si—SiO$_2$ Energy Barrier", 1983 IEEE, IEDM 83, pp. 396–399.

(List continued on next page.)

Primary Examiner—David C. Nelms
Assistant Examiner—Son Mai
Attorney, Agent, or Firm—Limbach & Limbach L.L.P.

[57] ABSTRACT

Multiple bits of data can be programmed into a single EPROM or FLASH memory cell by applying one of a number of programming voltages to the control gate of a memory cell that forms a punchthrough current during programming. The punchthrough current forms substrate hot electrons which, in addition to the channel hot electrons, accumulate on the floating gate. The charge on the floating gate converges to a stable threshold value which is linearly related to the programming voltage utilized. In addition, by utilizing the substrate hot electrons, a much lower control gate voltage can be utilized during programming.

6 Claims, 5 Drawing Sheets

OTHER PUBLICATIONS

K. R. Hofmann et al., "Hot–Electron and Hole–Emission Effects in Short n–Channel MOSFET's", IEEE Transactions on Electron Devices, vol. ED–32, No. 3, Mar. 1985, pp. 691–698.

Y. Nissan–Cohen, "A Novel Floating–Gate Method for Measurement of Ultra–Low Hole and Electron Gate Currents in MOS Transistors", IEEE Electron Device Letters, vol. EDL–7, No. 10, Oct. 1986.

R. Bez et al., "A Novel Method for the Experimental Determination of the Coupling Ratios in Submicron EPROM and Flash EEPROM Cells", 1990 IEEE, IEDM 90, pp. 99–102.

IEICE Transactions on Electoronics, vol. 77, No. 4, Apr. 1994, Tokyo JP, pp. 601–606, XP000460064 Kubuta et al: "A Proposal of New Multiple–Valued Mask–ROM–Design" p. 602, col. 1, line 4—p. 603, col. 1, line 30.

METHOD FOR PROGRAMMING A SINGLE EPROM OR FLASH MEMORY CELL TO STORE MULTIPLE BITS OF DATA THAT UTILIZES A PUNCHTHROUGH CURRENT

RELATED APPLICATION

This is a continuation-in-part of application Ser. No. 08/357,115 filed Dec. 16, 1994 by Albert Bergemont et al.

BACKGROUND OF THE INVENTION

1. Field of the Invention

The present invention relates to floating gate memory cells and, more particularly, to a method for programming a single EPROM or FLASH memory cell to store multiple bits of data, i.e., more than a logic "1" and a logic "0".

2. Description of the Related Art

FIG. 1 shows a cross-sectional drawing that illustrates a conventional n-channel, floating gate memory cell 10. As shown in FIG. 1, memory cell 10 includes an n-type source region 12 and an n-type drain region 14 which are formed a distance apart in a p-type substrate 16. The surface area of substrate 16 between the source and drain regions 12 and 14 defines a channel region 18 which is typically doped with additional p-type dopants (typically boron atoms) to adjust the threshold voltage of the cell.

Formed over the channel region 18 of substrate 16 is a stacked gate structure which includes a first insulation layer 20, a floating gate 22 formed over insulation layer 20, a second insulation layer 24 formed over floating gate 22, and a control gate 26 formed over insulation layer 24.

With 0.8 micron technology, memory cell 10 is conventionally programmed to store one of the two logic levels, i.e., a logic "1" or a logic "0", by grounding the source region 12 and substrate 16, applying a bias voltage VD in the range of 6–8 volts to the drain region 14, and applying a programming voltage VG of approximately 12 volts to control gate 26.

FIG. 2 shows a cross-sectional drawing that illustrates the result of these bias conditions on memory cell 10. As shown in FIG. 2, when the programming voltage is applied to control gate 26, a positive potential is induced on floating gate 22. The positive potential on floating gate 22, in turn, attracts electrons from the doped p-type atoms in the channel region 18 to the surface of substrate 16 to form a channel 30, and also repels holes from the doped p-type impurity atoms to form a depletion region 32.

When the bias voltage VD is applied to the drain region 14, an electric field is established between the source and drain regions 12 and 14 in channel region 30 and depletion region 32. The electric field accelerates the electrons in channel 30 which, in turn, have ionizing collisions that form "channel hot electrons". The positive potential of floating gate 22 attracts these channel hot electrons which penetrate insulation layer 20 and begin accumulating on floating gate 22.

The negative charge on floating gate 22 that results from the accumulated electrons, in turn, directly corresponds to the threshold voltage required to induce a defined current to flow through memory cell 10. Thus, when a large negative charge has accumulated on floating gate 22, the threshold voltage of the cell is large because a larger positive voltage must be applied to control gate 26 to compensate for the negative charge on floating gate 22. Similarly, if the cell has not been programmed, the threshold voltage is small because a smaller voltage will induce current to flow through the cell.

The above-described process is self-limiting because, as the number of electrons on floating gate 22 increases, the potential of floating gate 22 decreases until the potential on floating gate 22 is insufficient to create channel 30.

When memory cell 10 is read, a reference threshold voltage is applied to control gate 26 to again induce a potential on floating gate 22. If memory cell 10 has not been programmed, the positive charge on floating gate 22 will cause channel 30 to again be formed. As a result, current flows from the drain region 14 to the source region 12 through channel 30.

If memory cell 10 has been programmed, the potential on floating gate 22 is reduced by the accumulated electrons so that a much smaller current flows through channel 30. By then comparing the current to a reference current, the magnitude of the current can be interpreted to be either a logic "1" or a logic "0". In other words, if the threshold voltage of the cell is larger than the reference threshold voltage, then one logic level is present, whereas if the threshold voltage of the cell is smaller than the reference threshold voltage, then the other logic level is present.

Historically, the higher density of a memory array has been realized by reducing the feature sizes of the cells. As the feature sizes become ever smaller, however, this approach is becoming more costly and more difficult to implement.

Another approach to increasing the density of a memory array is to program each cell to store more than two logic levels. As stated above, memory cells are conventionally programmed to store one of two logic levels, i.e., a logic "1" or a logic "0". However, if each memory cell could be programmed to store a logic "00", "01", "10", or "11", then the density of an array could be doubled without changing the physical size of the array.

In theory, multi-level programming could be accomplished by varying the length of time that the programming voltage is applied to the control gate. Thus, for example, if the programming voltage was applied for a first time period, the floating gate would reach a corresponding first negative charge level. Similarly, if the programming voltage was applied for either a second, third, or fourth time period, the floating gate would reach either a corresponding second, third, or fourth negative charge level.

The problem with this type of multi-level programming, however, is that it is difficult to precisely control the number of electrons that accumulate on the floating gate because the reduced floating gate potential that results from the electrons accumulating on the floating gate causes fewer electrons to be attracted to the floating gate, thereby causing the number of electrons accumulated on the floating gate to vary over time. The greater the variation, the more difficult it is to compare current levels during a read operation and determine which logic level is present. As a result, there is a need for a method to accurately program a cell to store multiple logic levels.

SUMMARY OF THE INVENTION

The present invention provides a method for accurately programming a single memory cell to store one of three or more logic levels. As a result, rather than storing either a logic "1" or a logic "0", a single memory cell can store, for example, a logic "0-0", a "0-1", a "1-0", or a "1-1".

In the present invention, the memory cell includes a source formed in a well, a drain formed in the well a distance apart from the source, a floating gate formed over the well, and a control gate formed over the floating gate.

A method for programming the memory cell to store one of three or more logic levels as one of three or more threshold voltages includes the step of forming the floating-gate memory cell so that a punchthrough current flows from the drain to source during programming. The method also includes the step of selecting one of three or more programming voltages where the three or more programming voltages correspond to the three or more threshold voltages. After one of the programming voltages is selected, a first voltage is applied to the well and the source so that the source-to-well junction is in equilibrium. In addition, a second voltage, which is greater than the first voltage, is applied to the drain so that the drain-to-well junction is reverse-biased. After this, the selected programming voltage is applied to the control gate of the memory cell for a predetermined time.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
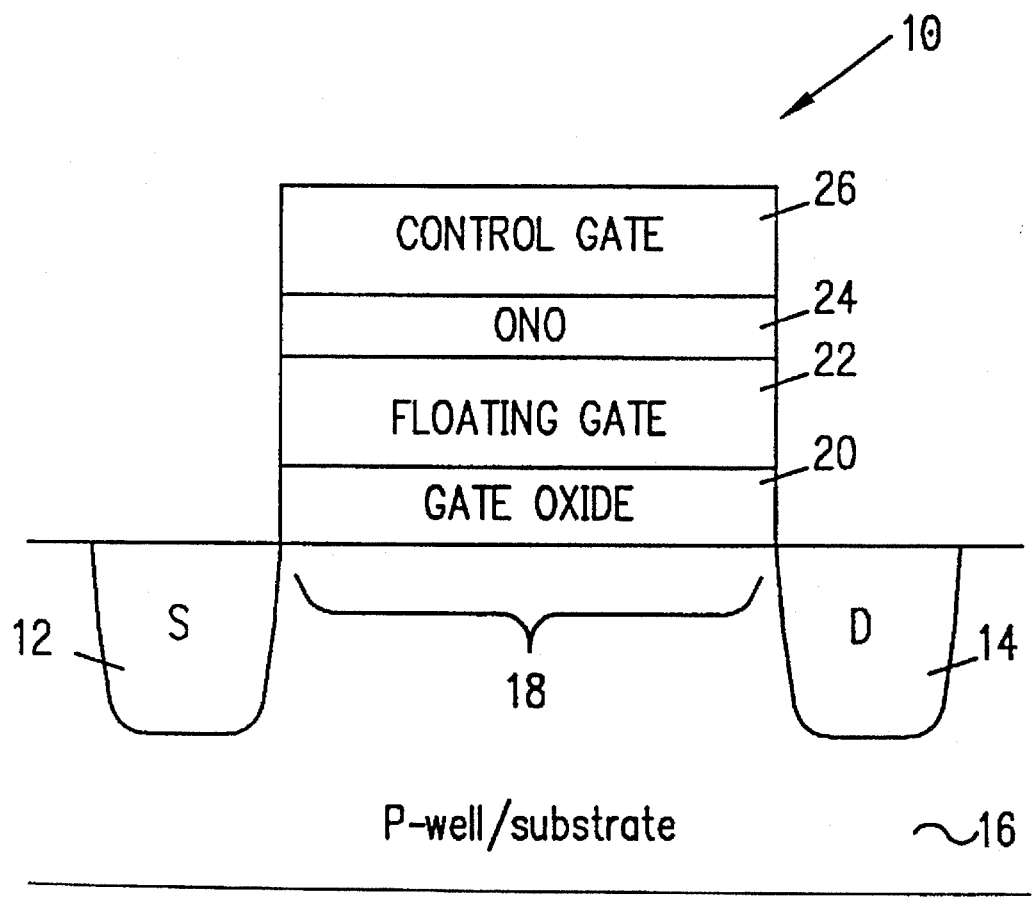
FIG. 1 is a cross-sectional drawing illustrating a conventional one-micron, n-channel, floating gate memory cell 10.
Figure 2:
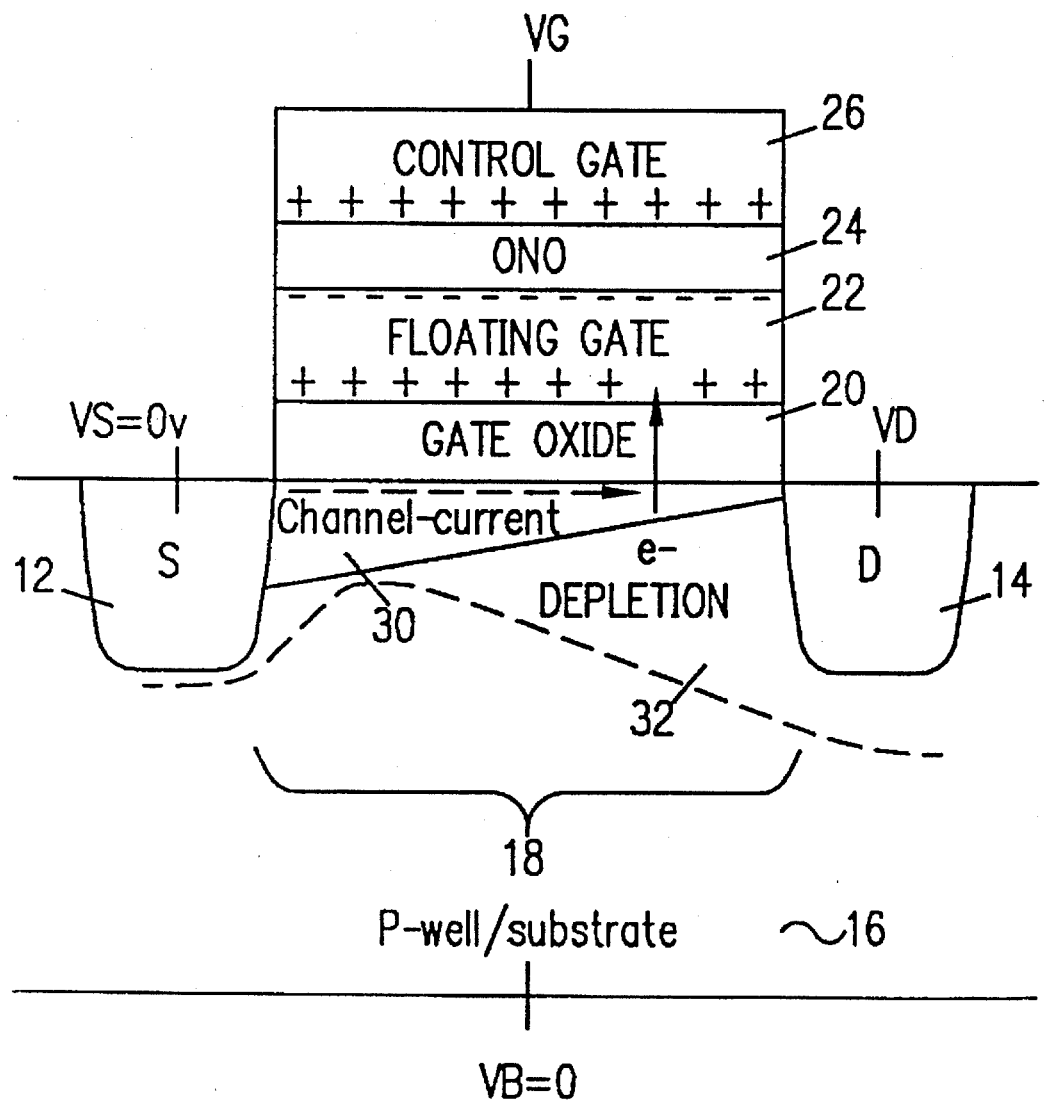
FIG. 2 is a cross-sectional drawing illustrating the bias conditions that result when memory cell 10 is programmed.
Figure 3:
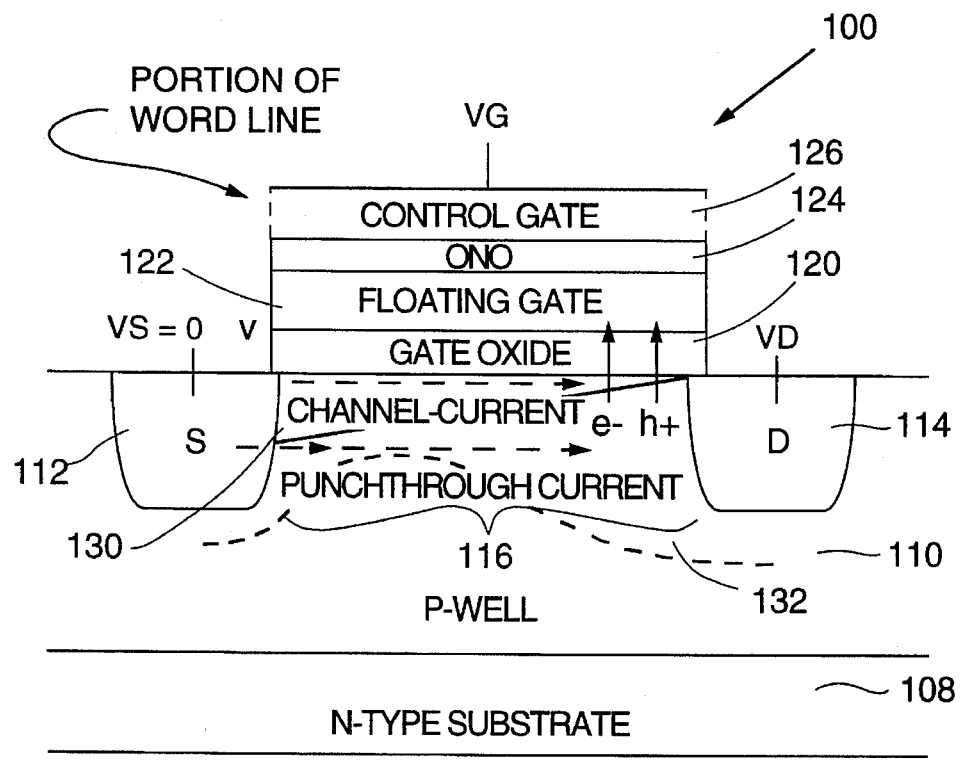
FIG. 3 is a cross-sectional drawing illustrating an n-channel, floating-gate memory cell 100 in accordance with the present invention.

FIG. 3 shows a cross-sectional drawing that illustrates an n-channel, floating-gate memory cell 100 in accordance with the present invention. As described in greater detail below, multiple bits of data can be programmed into a memory cell by applying a number of programming voltages to the control gate of a memory cell that forms a punchthrough current during programming.

As shown in FIG. 3, cell 100 is formed in a p-type well 110 which, in turn, is formed in an n-type substrate 108. Memory cell 100 includes an n-type source region 112, an n-type drain region 114, and a channel region 116 formed between the source and drain regions 112 and 114. The channel region 116 is doped with p-type impurity atoms to adjust the threshold voltage of the cell.

In accordance with the present invention, cell 100 is formed to produce a punchthrough current during programming. The channel lengths and doping levels, as well as the bias conditions, which are required to produce a punchthrough current through channel region 116 are well known in the art.

With 0.6 micron technology, for example, cell 100 preferably utilizes a channel length of 0.5–0.7 microns and a doping concentration of $1$–$2 \times 10^{17}$ p-type atoms. When smaller micron technologies are utilized, the channel length and the doping concentration can be reduced accordingly. Thus, for example, with 0.3 micron technology, cell 100 preferably utilizes a channel length of 0.2–0.4 microns and a doping concentration of $5 \times 10^{17}$ p-type atoms.

As further shown in FIG. 3, memory cell 100 also includes a first insulation layer 120 formed over channel region 116, a floating gate 122 formed over insulation layer 120, a second insulation layer 124 formed over floating gate 122, and a control gate 126 (a portion of word line WL) formed over insulation layer 124.

In accordance with the present invention, memory cell 100 is programmed to store one of three or more logic levels by maintaining an equilibrium across the source-to-well junction, reverse-biasing the drain-to-well junction, and applying one of a corresponding three or more programming voltages to control gate 126 during programming.

With 0.6 micron technology, memory cell 100 preferably utilizes a drain voltage that is 4–7 volts greater than the well voltage. In addition, although other voltages can be utilized, well 110 and source 112 are preferably grounded.

As above, when smaller micron technologies are utilized, the preferred conditions can be reduced accordingly. Thus, for example, with 0.3 micron technology, cell 100 preferably utilizes a drain voltage which is 2–4 volts greater than the well voltage.

In operation, when one of the programming voltages is applied to control gate 126, a positive potential is induced on floating gate 122 which, in turn, attracts electrons from the doped p-type atoms in channel region 116 to the surface of well 110 to form a channel 130. This potential also repels holes from the doped impurity atoms and forms a depletion region 132.

When the source and drain voltages are applied, an electric field is established between the source and drain regions 112 and 114. The electric field, as with conventional programming, accelerates the electrons in channel 130 which, in turn, have ionizing collisions that form channel hot electrons. The positive potential on floating gate 122 attracts these channel hot electrons which penetrate insulation layer 120 and begin accumulating on floating gate 122.

In addition to the formation of channel hot electrons, the present invention utilizes the punchthrough current to form substrate hot electrons which also collect on floating gate 122. In operation, due to the relatively short channel length, i.e., 0.5 microns in a 0.6 micron process, the electric field reduces the potential energy barrier at the source-to-well junction. The reduced potential energy barrier allows more majority carriers in source 112 to overcome the barrier which, in turn, produces the punchthrough current across the source-to-well junction.

As the electrons associated with the punchthrough current near drain 114, the electric field accelerates the electrons which, in turn, also have ionizing collisions that form substrate hot electrons. The positive potential on floating gate 122 also attracts these substrate hot electrons which penetrate insulation layer 120 and begin accumulating on floating gate 122.

However, unlike conventional floating-gate programming, the flow of electrons generated by the punchthrough current does not depend on the existence of a channel or the relative positive charge on floating gate 122. As a result, the electrons associated with the punchthrough current continue to accumulate on floating gate 122 after channel 130 has been turned off.

Thus, cell 100 is programmed by utilizing both channel hot electrons and substrate hot electrons to change the potential on floating gate 122. As a result of utilizing two sources of hot electrons, a significantly lower control gate voltage can be used during programming than is conventionally used to program a cell because fewer channel hot electrons need to be attracted to floating gate 122.

Figure 4:
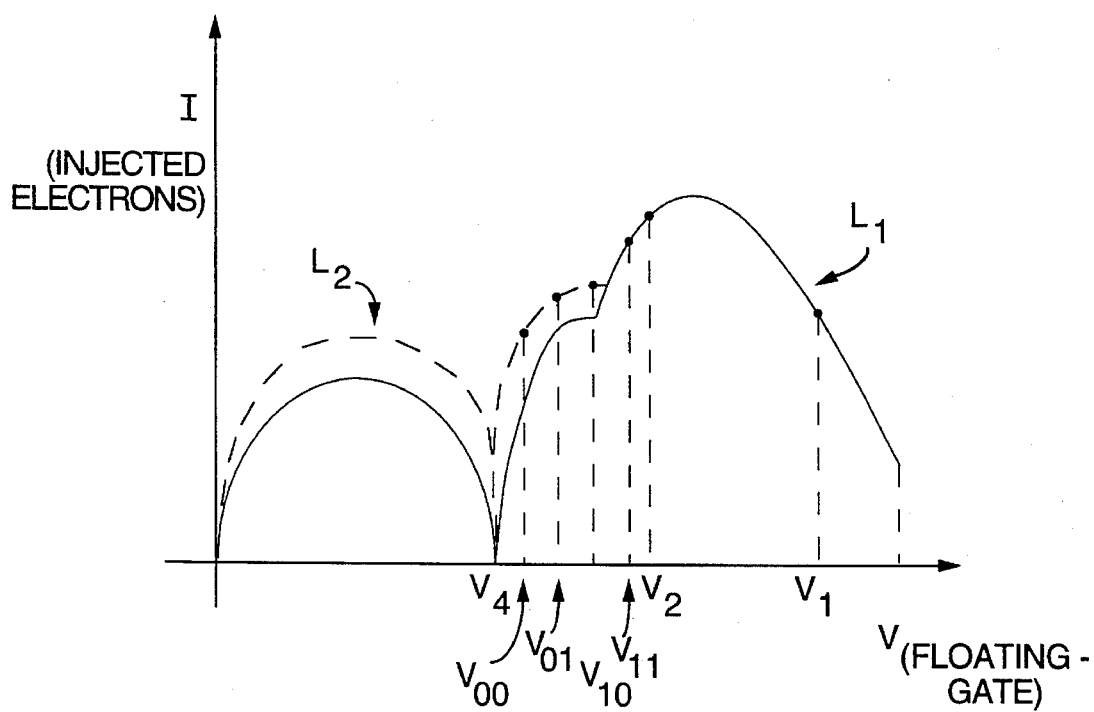
FIG. 4 is a graphical representation illustrating a cell programming characterization curve.

FIG. 4 shows a graphical representation that illustrates a cell programming characterization curve. As shown by lines $L_1$ and $L_2$ in FIG. 4, the voltage (V) on the floating gate influences the number of hot electrons (I) that are injected onto the floating gate.

Conventionally, the primary consideration in programming memory cells is the time required to place a defined amount of negative charge on the floating gate of the cell. As a result, the typical memory cell is designed to utilize an initial floating gate voltage $V_1$ and a final floating gate voltage $V_2$ that are positioned on opposite sides of the peak of the curve shown in FIG. 4, thereby taking advantage of the maximum injection of hot electrons onto the floating gate. As described, the initial floating gate voltage $V_1$ represents the voltage capacitively coupled to the floating gate from the control gate, while the final floating gate voltage $V_2$ represents the initial voltage $V_1$ reduced by the accumulated negative charge.

Figure 5:
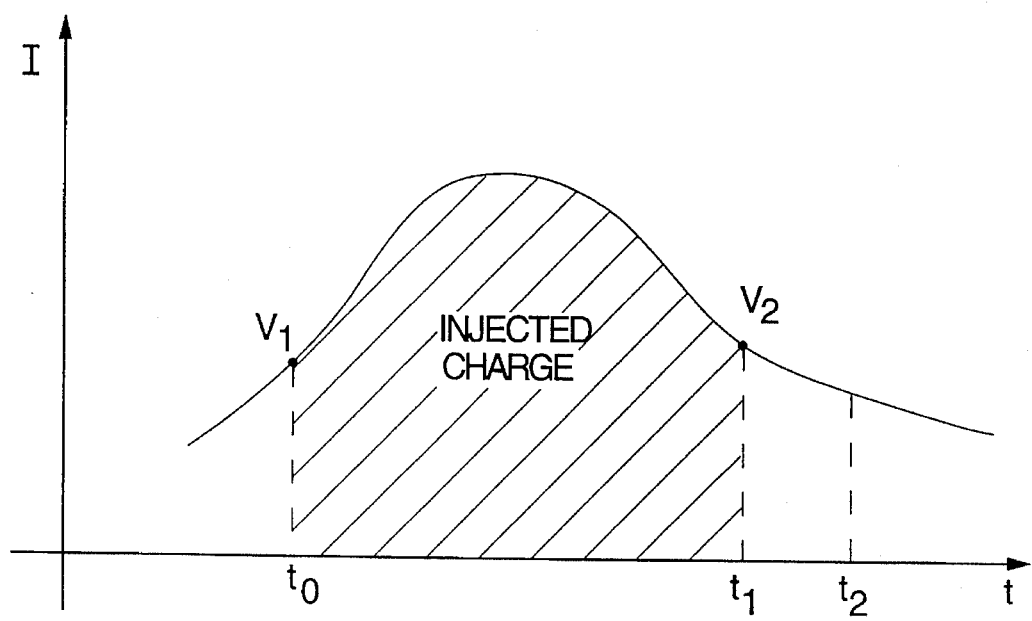
FIG. 5 is a graphical representation illustrating the current and the amount of negative charge injected onto the floating gate for initial and final floating-gate voltages $V_1$ and $V_2$.

FIG. 5 shows a graphical representation that illustrates the amount of negative charge injected onto the floating gate for initial and final voltages $V_1$ and $V_2$. As shown in FIG. 5, the amount of charge injected on the floating gate can be determined by integrating under the curve from the initial voltage $V_1$ at time $t_0$ to the final voltage $V_2$ at time $t_1$.

More importantly, however, FIG. 5 illustrates that any variation in the timing will cause a greater or lesser amount of negative charge to be injected onto the floating gate. Thus, for example, if the programming is terminated at time $t_2$ rather than time $t_1$, a greater amount of charge will be injected.

With conventional programming, this additional (or lesser) amount of negative charge does not present any problems because the cell is only being programmed to one of two logic levels. Thus, as long as the cell is programmed to have a minimum amount of charge, any additional charge is acceptable.

However, with multi-level programming, the accumulation of additional negative charge makes it difficult to determine which logic level is represented by the charge. Thus, to insure that the charge is within a defined range, the timing must be precisely controlled. This timing, however, is very difficult to control.

The present invention achieves multiple levels of injected charge by utilizing one of a plurality of initial voltages. Since the initial voltages are defined by the voltage capacitively coupled to the floating gate from the control gate, the initial voltages are selected by selecting one of a plurality of control voltages.

For example, referring again to FIG. 4, voltage $V_{00}$, $V_{01}$, $V_{10}$, or $V_{11}$ may be selected as the initial voltage by selecting a corresponding control gate voltage. As further shown in FIG. 4, the present invention utilizes voltage $V_4$ as the final voltage. The significance of utilizing voltage $V_4$ as the final voltage can be seen in FIG. 6.

Figure 6:
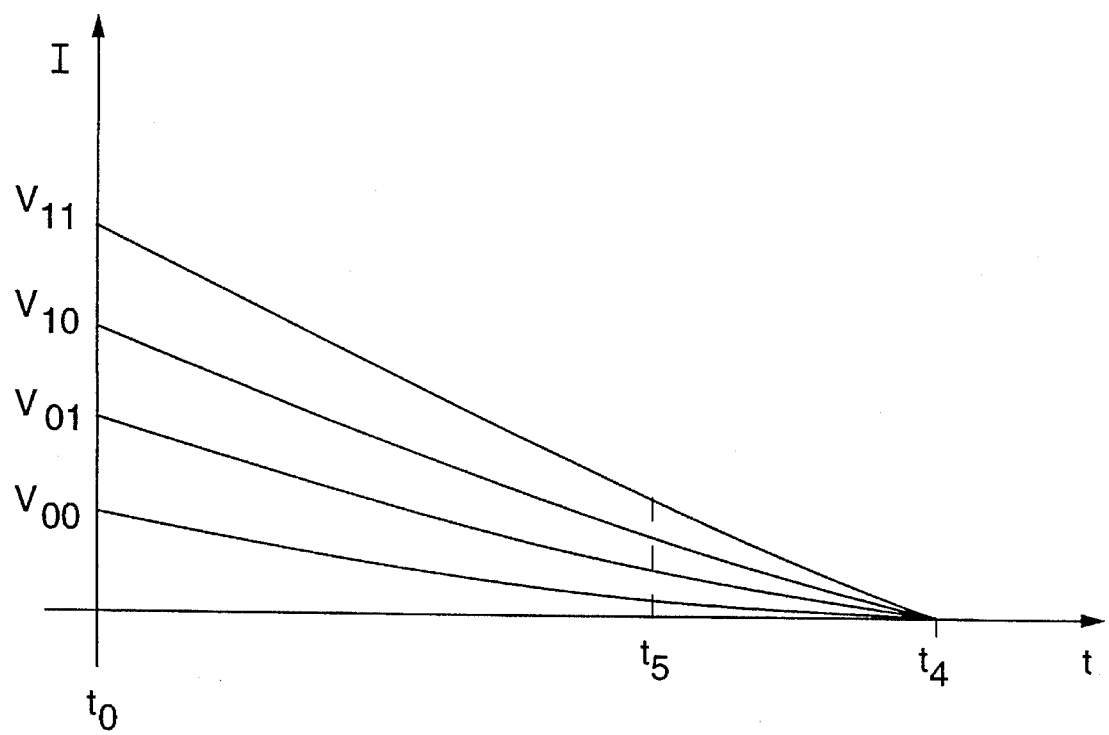
FIG. 6 is a graphical representation illustrating the current of negative charge injected onto the floating gate for initial floating-gate voltages $V_{00}$–$V_{11}$ and final voltage $V_4$.

FIG. 6 shows a graphical representation that illustrates the amount of negative charge injected onto the floating gate for initial voltages $V_{00}$–$V_{11}$ and final voltage $V_4$. As shown in FIG. 6, the amount of negative charge injected on the floating gate can be determined by integrating under the curve from each of the initial voltages $V_{00}$–$V_{11}$ at time $t_0$ to the final voltage $V_4$ at time $t_4$.

FIG. 6, however, also illustrates that because the injected charge converges towards zero for each initial voltage $V_{00}$–$V_{11}$, the injected charge is largely insensitive to timing variations. Thus, the floating gate can still have one of a plurality of discrete levels of injected charge if programming is terminated anytime between time $t_4$ and $t_5$ because the amount of additional charge during this time is so small.

One drawback of the approach, as described, is that the magnitude of the injected current drops as the voltage on the floating gate approaches the final voltage $V_4$ (see FIG. 4). As a result, it takes a greater amount of time to program the cell.

In accordance with the present invention, however, line L1 of FIG. 4 can be altered, as shown by line L2, by increasing the formation of substrate hot electrons as described above. Thus, although the time required to program a memory cell in accordance with the present invention remains longer than conventional programming, the formation of substrate hot electrons substantially narrows the time difference.

Figure 7:
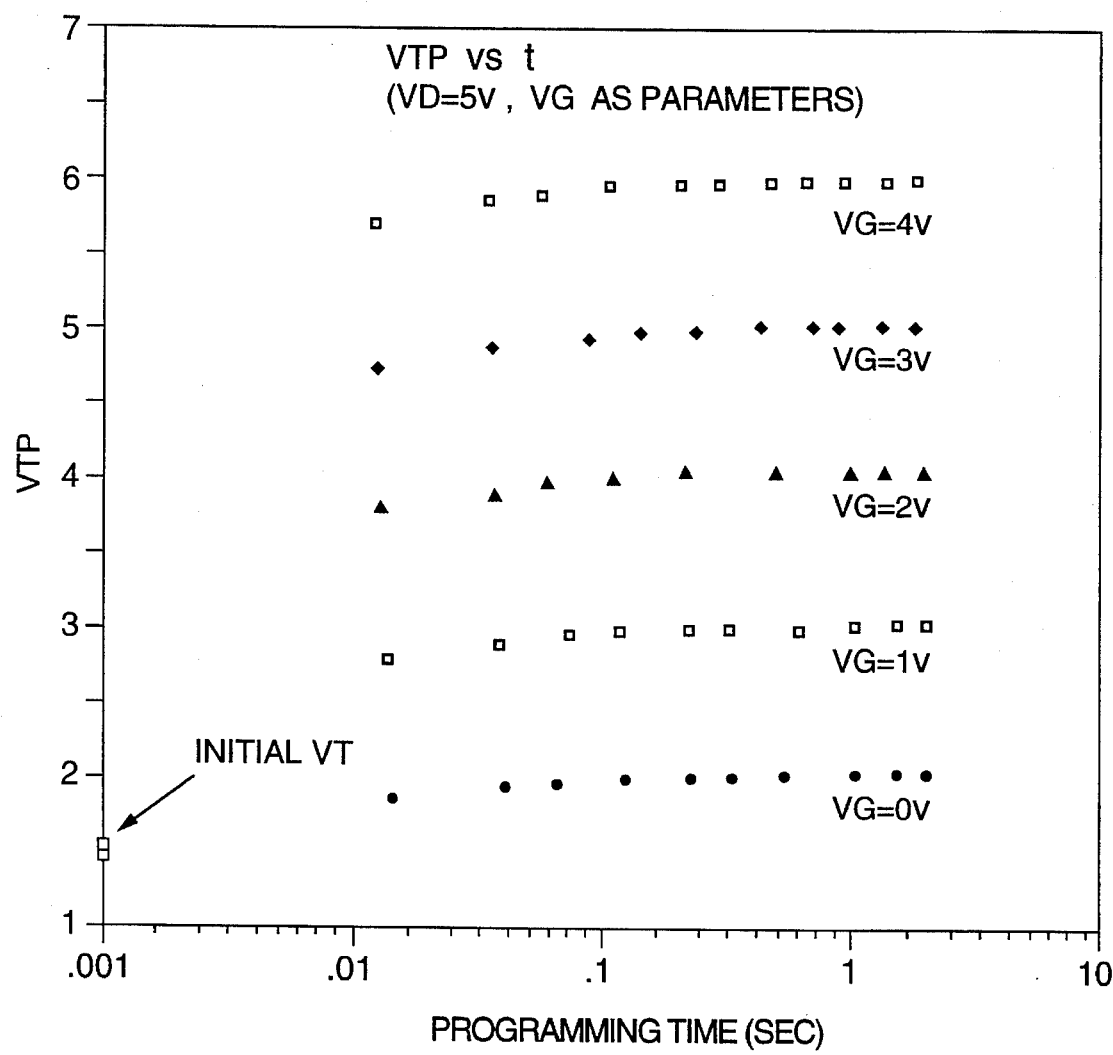
FIG. 7 is a graphical representation illustrating a series of experimental results.

FIG. 7 shows a graphical representation that illustrates a series of experimental results. As shown in FIG. 7, when one volt was applied to the control gate, the charge on the floating gate converged to a threshold voltage of approximately three volts from an initial threshold voltage of 1.5 volts within 50 milliseconds or less. Similarly, when two, three; and four volts were applied to the control gate, the charge on the floating gate converged to threshold voltages of approximately four, five, and six volts, respectively, within 50 milliseconds or less. Although an initial threshold voltage of 1.5 volts was utilized in the above experiment, any initial threshold voltage after erase may be utilized.

Since the charge on the floating gate converges to a stable value which corresponds to a defined threshold voltage within 50 milliseconds or less, a single floating gate memory cell can be programmed to have one of a plurality of threshold voltages by applying the corresponding voltage to the control gate during programming. As a result, a single floating gate memory cell can be utilized to store two or more bits of data.

For example, a 0-0 could be represented by a threshold voltage of 3 volts, while a 0-1 could be represented by a threshold voltage of 4 volts. Similarly, a 1-0 could be represented by a threshold voltage of 5 volts, while a 1-1 could be represented by a threshold voltage of 6 volts.

As further shown in FIG. 7, the experimental results also show that changes in the control gate voltage are linearly related to changes in the threshold voltage, i.e., a one volt increase in the control gate voltage increases the threshold voltage by one volt. As a result, memory cell 100 is not limited to representing two bits, but can represent any number of bits depending on the sensitivity of the current sense detectors utilized to discriminate one threshold voltage from another. Furthermore, even a continuous analog level can be stored in a cell as a threshold voltage.

For example, a 0-0-0 could be represented by a threshold voltage of 3 volts, while a 0-0-1 could be represented by a threshold voltage of 3.5 volts. Similarly, a 0-0-0-0 could be represented by a threshold voltage of 3 volts, while a 0-0-0-1 could be represented by a threshold voltage of 3.25 volts.

In the preferred embodiment, the dimensions of cell 100, as well as the bias voltages, are selected to optimize the formation of the punchthrough current. Alternately, less punchthrough current than is optimally obtainable can also be utilized. The result of utilizing less punchthrough current, however, is that it takes more time, i.e., greater than 50 milliseconds, for the charge on the floating gate to converge to the desired threshold voltage.

Thus, as described above, when an equilibrium condition is maintained across the source-to-well junction, and the drain-to-well junction is reverse-biased, cell 100 can be programmed to store three or more logic levels by applying one of a corresponding three or more programming voltages to the control gate (word line).

As stated above, one advantage of the present invention is that the memory cell 100 can be programmed to store multiple bits of data by utilizing a programming voltage that is considerably less than the programming voltage typically used, i.e., less than five volts in the present invention compared to the approximately 12 volts that are typically used. In addition to providing a substantial power savings for low power applications, such as notebook computers, the present invention eliminates the need to form charge pumps on memory chips to produce the programming voltage, i.e., the 12 volts.

As is well known, charge pumps can consume a significant area, i.e., up to 30% of the total die area of a memory chip. Thus, by eliminating the need for charge pumps, the present invention significantly reduces the area required for a memory cell, and therefore the cost of a memory.

The elimination of high programming voltages also leads to an increase in the density of an array of cells because less isolation is required between both memory cells and the peripheral circuitry. Conventionally, punchthrough current is considered undesirable. In 0.6 micron technology, the minimum channel length that can be obtained without inducing a punchthrough current during normal functioning is approximately 0.6 microns.

However, since the present invention utilizes punchthrough current, a 0.6 micron channel length limitation no longer applies. In 0.6 micron technology, punch-through current can be obtained without breaking down the cell by utilizing channel lengths in the range of approximately 0.4 to 0.6 microns. As a result, the present invention substantially reduces the size of an array of cells, thereby increasing the density of the array.

It should be understood that various alternatives to the embodiment of the invention described herein may be employed in practicing the invention. For example, although the present invention has been described in terms of an n-channel, floating-gate memory cell, the present invention equally applies to a p-channel, floating-gate memory cell.

Thus, it is intended that the following claims define the scope of the invention and that methods and structures within the scope of these claims and their equivalents be covered thereby.

What is claimed is:

1. A method for programming a single floating-gate memory cell to have one of three or more threshold voltages, the memory cell having a source and drain formed a distance apart in the well that define a channel therebetween, a layer of first insulation material formed over the channel, a floating gate formed over the layer of first insulation material, a layer of second insulation material formed over the floating gate, and a control gate formed over the layer of second insulation material, the method comprising the steps of:

selecting one of three or more programming voltages as a selected programming voltage, the three or more programming voltages corresponding to said three or more threshold voltages;

applying a first voltage to the well;

applying the first voltage to the source so that the source-to-well junction is in equilibrium;

applying a second voltage to the drain so that the drain-to-well junction is reverse-biased, the drain-to-source voltage is positive, and a punchthrough current is induced to flow from the drain to the source; and applying the selected programming voltage to the control gate of the memory cell.

2. The method of claim 1 wherein the first voltage includes ground.

3. The method of claim 1 wherein the second voltage is greater than the first voltage by two or more volts.

4. The method of claim 1 wherein a maximum programming voltage is less than or equal to five volts.

5. A method for programming a single floating-gate memory cell to have one of three or more threshold voltages, the memory cell having a source and drain formed a distance apart in the well that define a channel therebetween, a layer of first insulation material formed over the channel, a floating gate formed over the layer of first insulation material, a layer of second insulation material formed over the floating gate, and a control gate formed over the layer of second insulation material, the method comprising the steps of:

providing the floating-gate memory cell so that a punchthrough current flows from the drain to source during programming;

selecting one of three or more programming voltages as a selected programming voltage, the three or more programming voltages corresponding to said three or more threshold voltages;

applying a first voltage to the well;

applying the first voltage to the source so that a source-to-well junction is in equilibrium;.

applying a second voltage to the drain so that a drain-to-well junction is reverse-biased, the second voltage being greater than the first voltage; and applying the selected programming voltage to the control gate of the memory cell for a time less than or equal to 50 milliseconds.

6. A method for programming a single floating-gate memory cell to have one of three or more threshold voltages, the memory cell having a source and drain formed a distance apart in the well that define a channel therebetween, a layer of first insulation material formed over the channel, a floating gate formed over the layer of first insulation material, a layer of second insulation material formed over the floating gate, and a control gate formed over the layer of second insulation material, the method comprising the steps of:

selecting one of three or more programming voltages as a selected programming voltage, the three or more programming voltages corresponding to said three or more threshold voltages; and applying the selected programming voltage to the control gate, a first voltage to the source and well, and a second voltage to the drain so that the drain-to-well junction is reverse-biased, the drain-to-source voltage is positive, and a punchthrough current is induced to flow from the drain to the source.

* * * * *